United States Patent
Wu et al.

(10) Patent No.: US 10,645,822 B2
(45) Date of Patent: May 5, 2020

(54) LOCATING DEVICE

(71) Applicant: HANWIT PRECISION INDUSTRIES LTD., New Taipei (TW)

(72) Inventors: Ming-De Wu, New Taipei (TW); Ching-Kai Chang, New Taipei (TW)

(73) Assignee: Hanwit Precision Industries Ltd., New Taipei (TW)

( * ) Notice: Subject to any disclaimer, the term of this patent is extended or adjusted under 35 U.S.C. 154(b) by 0 days.

(21) Appl. No.: 16/357,667

(22) Filed: Mar. 19, 2019

(65) Prior Publication Data

US 2019/0394889 A1    Dec. 26, 2019

Related U.S. Application Data

(63) Continuation-in-part of application No. 16/241,362, filed on Jan. 7, 2019.

(30) Foreign Application Priority Data

Jun. 26, 2018  (TW) .............................. 107121932 A

(51) Int. Cl.
| | |
|---|---|
| *H05K 5/00* | (2006.01) |
| *H05K 5/02* | (2006.01) |
| *H05K 5/03* | (2006.01) |

(52) U.S. Cl.
CPC ......... *H05K 5/0013* (2013.01); *H05K 5/0204* (2013.01); *H05K 5/0221* (2013.01); *H05K 5/03* (2013.01)

(58) Field of Classification Search
CPC ...... H05K 5/0013; H05K 5/0204; H05K 5/03; H05K 5/0221; H05K 5/0004

USPC .......... 361/679.58, 724–727, 801; 312/223.2
See application file for complete search history.

(56) References Cited

U.S. PATENT DOCUMENTS

| | | | | |
|---|---|---|---|---|
| 9,575,518 | B2 * | 2/2017 | Geng ..................... | G06F 1/182 |
| 9,788,442 | B2 * | 10/2017 | Li ......................... | H05K 5/0221 |
| 2003/0105892 | A1 * | 6/2003 | Numano ............... | G06F 1/1632 |
| | | | | 710/14 |
| 2004/0222647 | A1 * | 11/2004 | Smith .................. | E05C 19/006 |
| | | | | 292/336.3 |

(Continued)

*Primary Examiner* — Daniel P Wicklund
*Assistant Examiner* — Sagar Shrestha
(74) *Attorney, Agent, or Firm* — Muncy, Geissler, Olds & Lowe, P.C.

(57) ABSTRACT

A locating device includes casing including position-limiting member defining therein receiving space and two opposing receiving slots and mounting structure on two opposite side walls thereof, fitting member having recess, through hole cut through recess, axle structure provided in recess and positioning structure for positioning in mounting structure of casing, and operating device set including lever having pivot connection head inserted through through hole into receiving space, pivot connection portion located on pivot connection head and pivotally connected to axle structure and sliding slot located on pivot connection head and sliding rod movably mounted in sliding slot and having end portion located on each of two opposite ends thereof and disposed in receiving slot. Operating device set is movable relative to fitting member between an open position where the positioning structure is unlocked from mounting structure, and a close position where the positioning structure is locked to mounting structure.

9 Claims, 9 Drawing Sheets

(56) References Cited

U.S. PATENT DOCUMENTS

| | | | | |
|---|---|---|---|---|
| 2007/0217137 A1* | 9/2007 | Chen | ............... | G06F 1/181 |
| | | | | 361/807 |
| 2010/0223761 A1* | 9/2010 | Chen | ............... | G06F 1/181 |
| | | | | 24/1 |
| 2013/0026893 A1* | 1/2013 | Chen | ............... | G06F 1/181 |
| | | | | 312/223.2 |
| 2013/0146596 A1* | 6/2013 | Chen | ............... | G06F 1/181 |
| | | | | 220/262 |
| 2014/0013811 A1* | 1/2014 | Yang | ............... | E05B 65/006 |
| | | | | 70/163 |
| 2014/0097729 A1* | 4/2014 | Kuo | ............... | G06F 1/18 |
| | | | | 312/223.2 |

* cited by examiner

LOCATING DEVICE

This application is a Continuation-In-Part of application Ser. No. 16/241,362, filed on Jan. 7, 2019, for which priority is claimed under 35 U.S.C. § 120, the entire contents of which are hereby incorporated by reference.

This application claims the priority benefit of Taiwan patent application number 107121932, filed on Jun. 26, 2018.

BACKGROUND OF THE INVENTION

1. Field of the Invention

The present invention relates to a locating device, more particularly to the locating device including an operating device set with a lever, and when the lever of the operating device set is biased the lever is moved with the sliding slot thereof along the sliding rod, causing the pivot connection portion of the lever to carry the positioning structure of the pivotally connected fitting member into engagement with the mounting structure of the casing. By means of one single biasing action to lock the fitting member to the casing, the operation of the present invention is simple. This makes it easy to operate and speeds up the assembly of the entire installation job.

2. Description of the Related Art

Since the large number of storage medium machines are placed and located in the general host computer chassis, the server chassis, the storage or telecommunications cabinet, the operation of replacing the storage medium machine must be simpler and faster for a user to perform repair or replacement work on each recording medium machine, and the assembly structure and component manufacturing costs need to be considered in order to meet the great amount of requirements and costs of the storage medium machines. Furthermore, the chassis is usually used for a long-term period, so it is necessary to consider the stability of the overall system and the convenience of repair and replacement, to facilitate the user to operate, thereby reducing the loss of downtime and manpower. However, some of the storage medium machines currently used are fastened and located in the chassis by screw locking manner, and the screws are inserted through holes of the chassis and then locked into the screw holes of the storage medium machine, respectively. The screw locking manner requires a lot of screws, and the screws also must be removed one by one in order to demount the storage medium machine, and it results in a lot of man-hours for assembly, and significantly increased downtime for maintenance. When the chassis is filled with interface cards, storage medium machines, power lines, cables and other devices, it is very inconvenient to insert a tool for locking screw, and the screw possibly falls to lost during the locking operation. Furthermore, if the size of the screw does not match the screw hole but the screw is still locked into the screw hole by force, it is easy to damage the screw hole on the storage medium machine, and it is not convenient for further assembly or disassembly. Since the server chassis is widely used in machine rooms of telecommunication or storage systems and data center, what is needed is to develop a locating device to locate a group of storage medium machines in the server chassis without occupying too much space, and the storage medium machine can be repaired or replaced easily, so that the number of the storage medium machines installed in the machine room can be greatly increased and the user can quickly and easily dismount the storage medium machine for repair and replacement.

SUMMARY OF THE INVENTION

The present invention has been accomplished under the circumstances in view. It is therefore the main object of the present invention to provide a locating device, which comprises a casing, a fitting member and an operating device set. The casing comprises a position-limiting member on a top side thereof, and a mounting structure on at least one of two opposite side walls thereof. The position-limiting member comprises a receiving space, and a receiving slot on at least one of two opposite lateral sides of the receiving space. The fitting member comprises a recess, a through hole cut through a bottom wall of the recess, an axle structure provided in the recess, and a positioning structure located on at least one of two opposite side walls thereof for positioning in the mounting structure of the casing. The operating device set comprises a lever and a sliding rod. The lever comprises a pivot connection head extended from a front side thereof and inserted through the through hole into the receiving space, a pivot connection portion located on the pivot connection head and pivotally connected to the axle structure, and a sliding slot located on the pivot connection head and disposed at a front side relative to the pivot connection portion. The sliding rod is movably mounted in the sliding slot, comprising an end portion located on at least one of two opposite ends thereof and disposed in the receiving slot. The operating device set is movable relative to the fitting member between an open position and a close position. When in the open position, the positioning structure of the fitting member is unlocked from the mounting structure of the casing. When in the close position, the positioning structure of the fitting member is locked to the mounting structure of the casing. When the operating device set is moved from the open position to the close position, the lever is moved with the sliding rod in said sliding slot, causing displacement of the pivot connection portion to carry the fitting member to move relative to the casing. Therefore, it is not necessary to use complicated assembly actions such as screw locking, so as to reduce the overall operation difficulty and achieve the purpose of improving the overall assembly speed.

According to another aspect of the present invention, after the fitting member is positioned in the casing, the design of the receiving slot of the position-limiting member prevents disconnection of the fitting member from the casing in the horizontal direction. Further, the engagement between the mounting structure of the casing and the positioning structure of the fitting member prevents disconnection of the fitting member from the casing in the vertical direction. Therefore, when the operating device set is biased to the close position, the fitting member is prohibited from moving out of the casing in the horizontal direction or the vertical direction, ensuring connection stability.

According to still another aspect of the present invention, when the operating device set is biased from the open position to the close position, the fitting member is locked to the casing. By means of one single biasing action to lock the fitting member to the casing, the operation of the present invention is simple. This makes it easy to operate, and speeds up the assembly of the entire installation job.

According to still another aspect of the present invention, when moving the end portion of the sliding rod into the respective receiving slot of the position-limiting member, the roller at the end portion facilitates movement of the end portion into the respective receiving slot without causing damage to the inner wall of the receiving slot.

Other and further benefits, advantages and features of the present invention will be understood by reference to the following specification in conjunction with the accompanying drawings, in which like reference characters denote like elements of structure.

DETAILED DESCRIPTION OF THE PREFERRED EMBODIMENT

Figure 1:
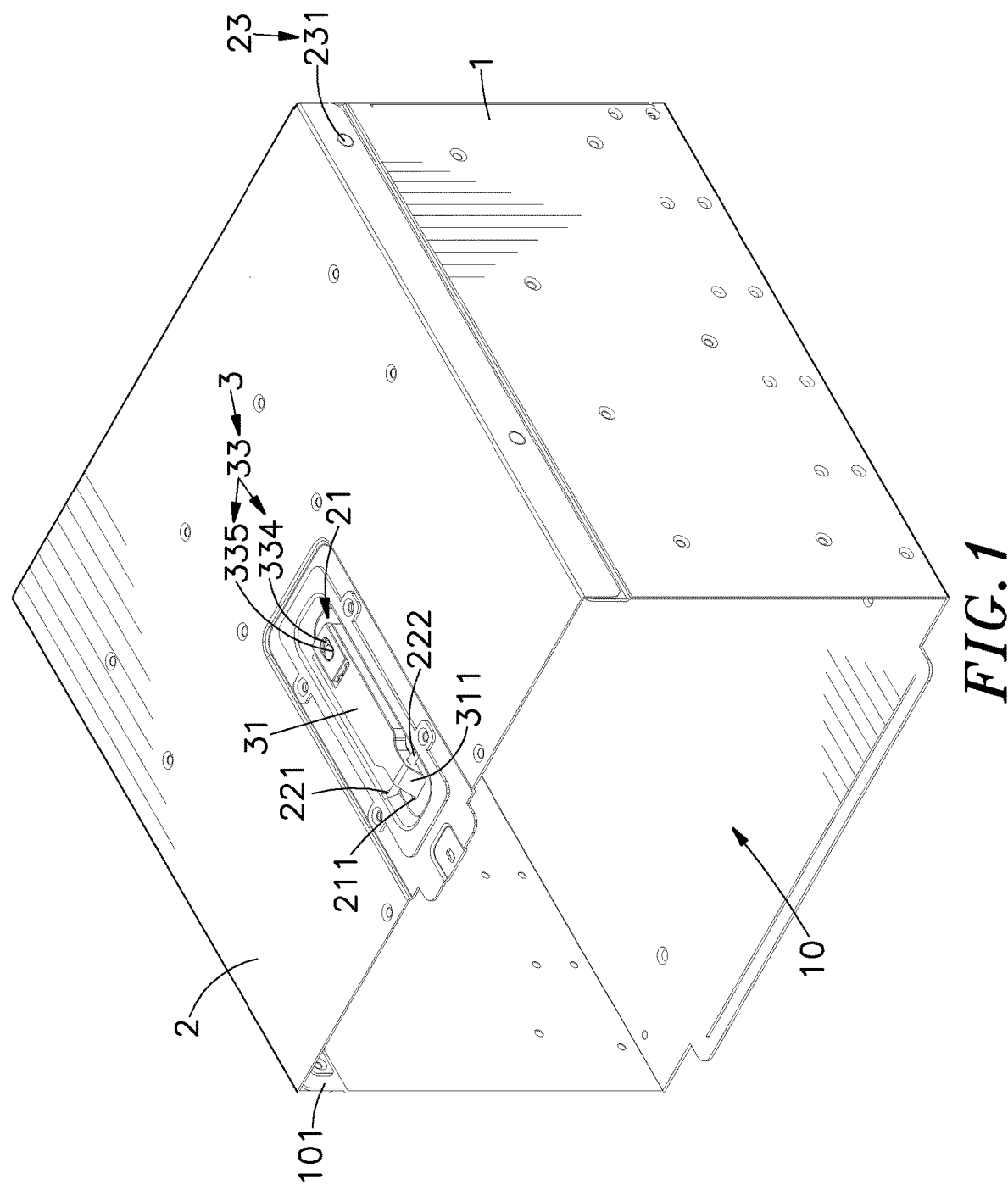
FIG. 1 is an oblique top elevational view of a locating device in accordance with the present invention.
Figure 2:
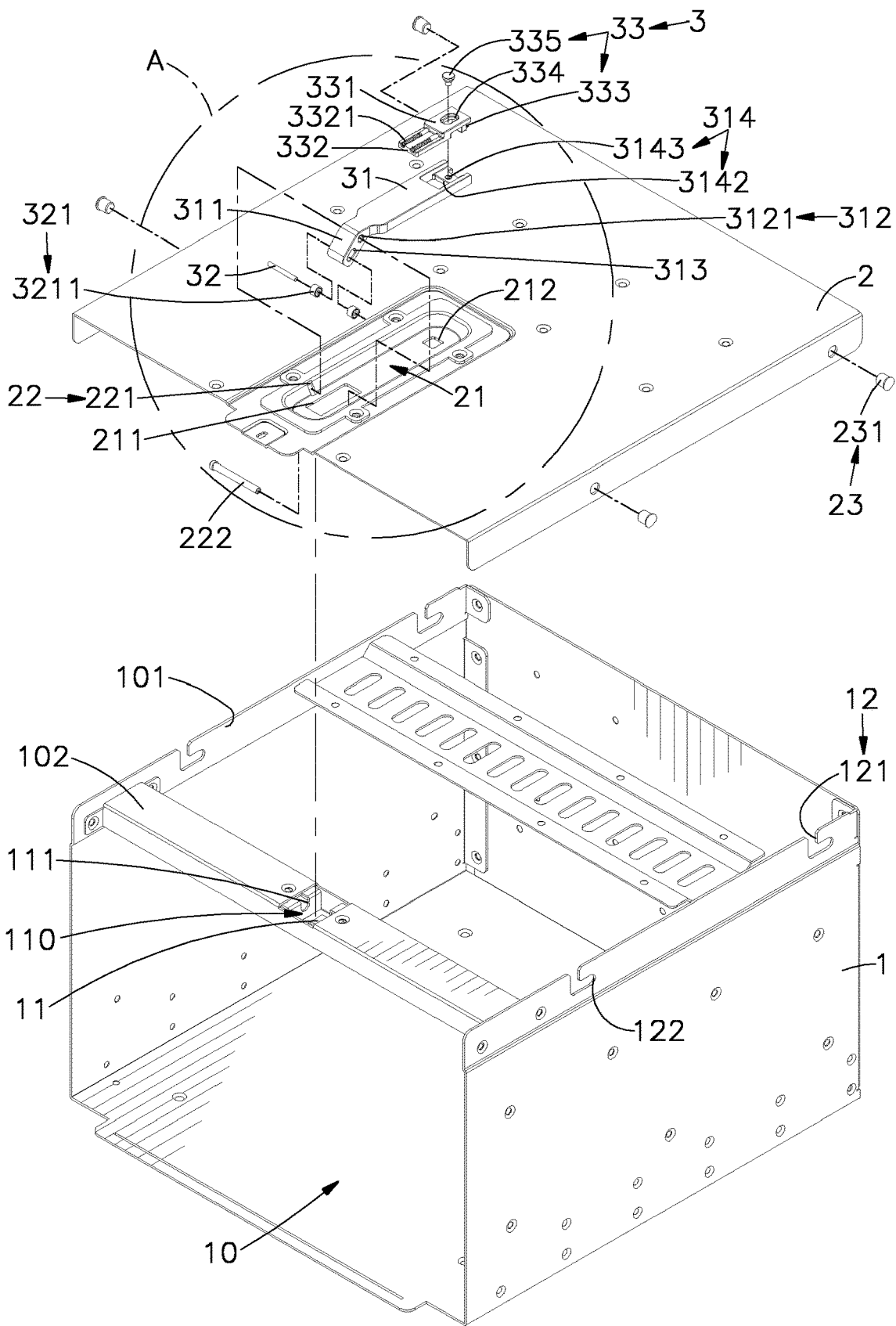
FIG. 2 is an exploded view of the locating device in accordance with the present invention.
Figure 3:
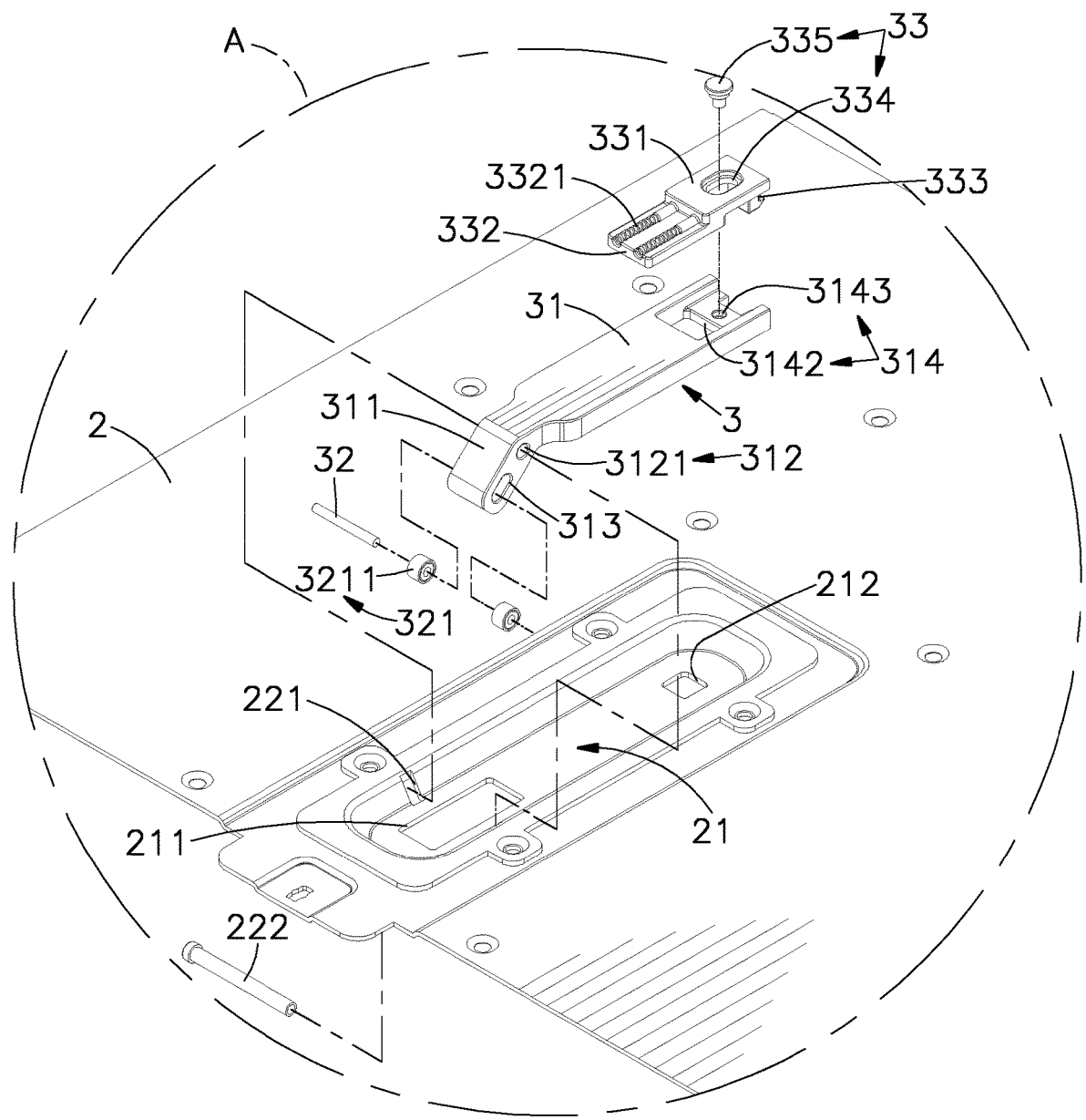
FIG. 3 is an enlarged view of part A of FIG. 2.
Figure 4:
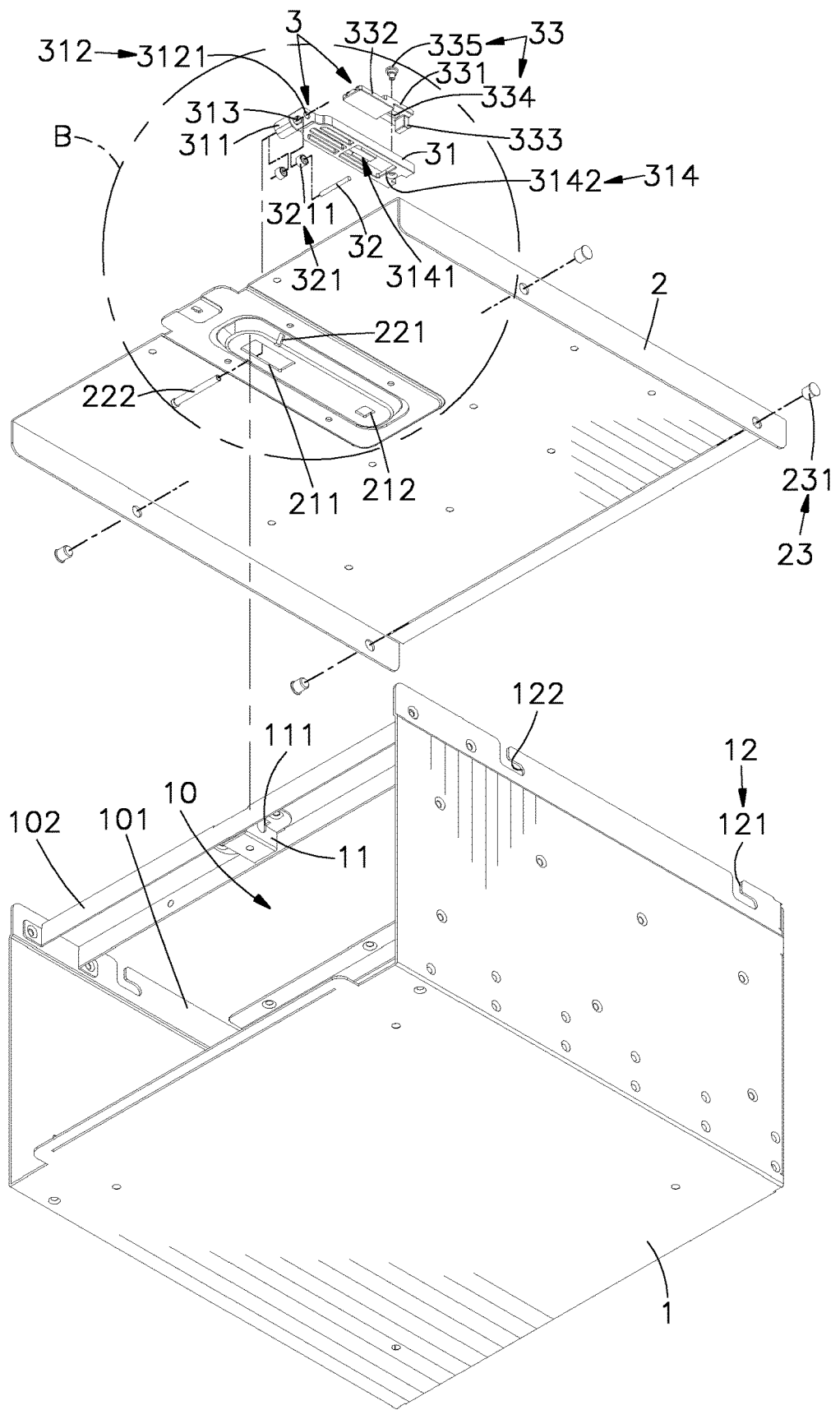
FIG. 4 corresponds to FIG. 2 when viewed from another angle.
Figure 5:
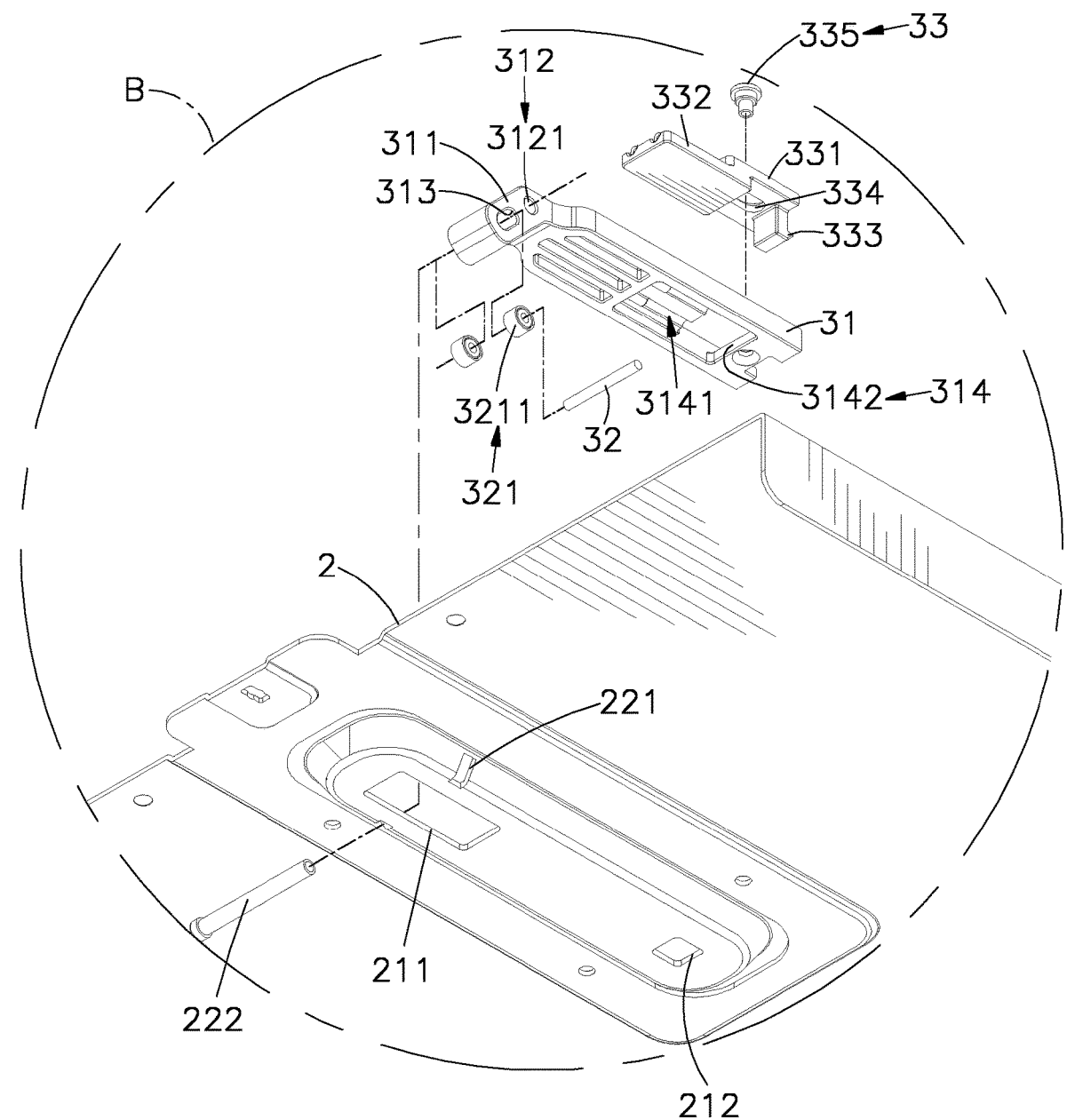
FIG. 5 is an enlarged view of part B of FIG. 4.

Referring to FIGS. 1-5, a locating device in accordance with the present invention is shown. The locating device comprises a casing 1, a fitting member 2 and an operating device set 3.

The casing 1 defines an accommodation chamber 10 therein, and an opening 101 on a top side of the accommodation chamber 10. A bracket 102 is transversely mounted in the opening 101. A position-limiting member 11 is mounted on the bracket 102. The position-limiting member 11 has a receiving space 110 defined therein, and a U-shaped receiving slot 111 on at least one of two opposite lateral sides of the receiving space 110 at the top. The casing 1 has a mounting structure 12 located on at least one of two opposite lateral sides thereof. In this embodiment, the mounting structure 12 comprises a plurality of sliding slots 121 vertically downwardly extended from the topmost edge of each of the two opposite lateral sides of the casing 1, and a positioning slot 122 respectively and transversely extended from a bottom end of each sliding slot 121.

The fitting member 2 has a recess 21 inwardly curved from a top side thereof, a through hole 211 cut through a bottom wall of the recess 21 at one side, and a retaining hole 212 cut through the bottom wall of the recess 21 at an opposite side. A axle structure 22 is provided in the recess 21. The axle structure 22 comprises two axle holes 221 respectively located on two opposite sidewalls of the recess 21, and an axle rod 222 mounted between the two axle holes 221. The fitting member 2 further has a positioning structure 23 located on at least one of two opposite lateral sides thereof. In this embodiment, the positioning structure 23 comprises a plurality of positioning rods 231 respectively protruded from the two opposite lateral sides of the fitting member 2.

The operating device set 3 comprises a lever 31, a sliding rod 32 and a buckle 33. The lever 31 has a pivot connection head 311 obliquely downwardly extended from a front end thereof, a pivot connection portion 312, i.e., a pivot hole 3121 transversely cut through the pivot connection head 311, a sliding slot 313 transversely cut through the pivot connection head 311 at a front side relative to the pivot connection portion 312, a mounting plate 314 located on an opposing rear end thereof, a mounting groove 3141 located on a bottom side of the mounting plate 314, a pass-through hole 3142 cut through the mounting plate 314 in communication with the mounting groove 3141, and a fastening hole 3143 located on the mounting plate 314 at one side relative to the pass-through hole 3142. The sliding rod 32 is movably mounted in the sliding slot 313 of the lever 31, having opposing end portions 321 thereof respectively mounted with a roller 3211. The two rollers 3211 are disposed outside the pivot connection head 311. The buckle 33 is fastened to the mounting plate 314 of the lever 31. The buckle 33 comprises a flat base 331, a front plate 332 extended from a front side of the base 331 and disposed in the mounting groove 3141, at least one elastic member 3321 mounted on a top side of the front plate 332 and elastically abutted against the bottom side of the mounting plate 314, a hook block 333 protruded from a bottom side of the base 331, and a mounting through hole 334 cut through the base 331 and fastened to the fastening hole 3143 by a fastener 335.

Figure 6:
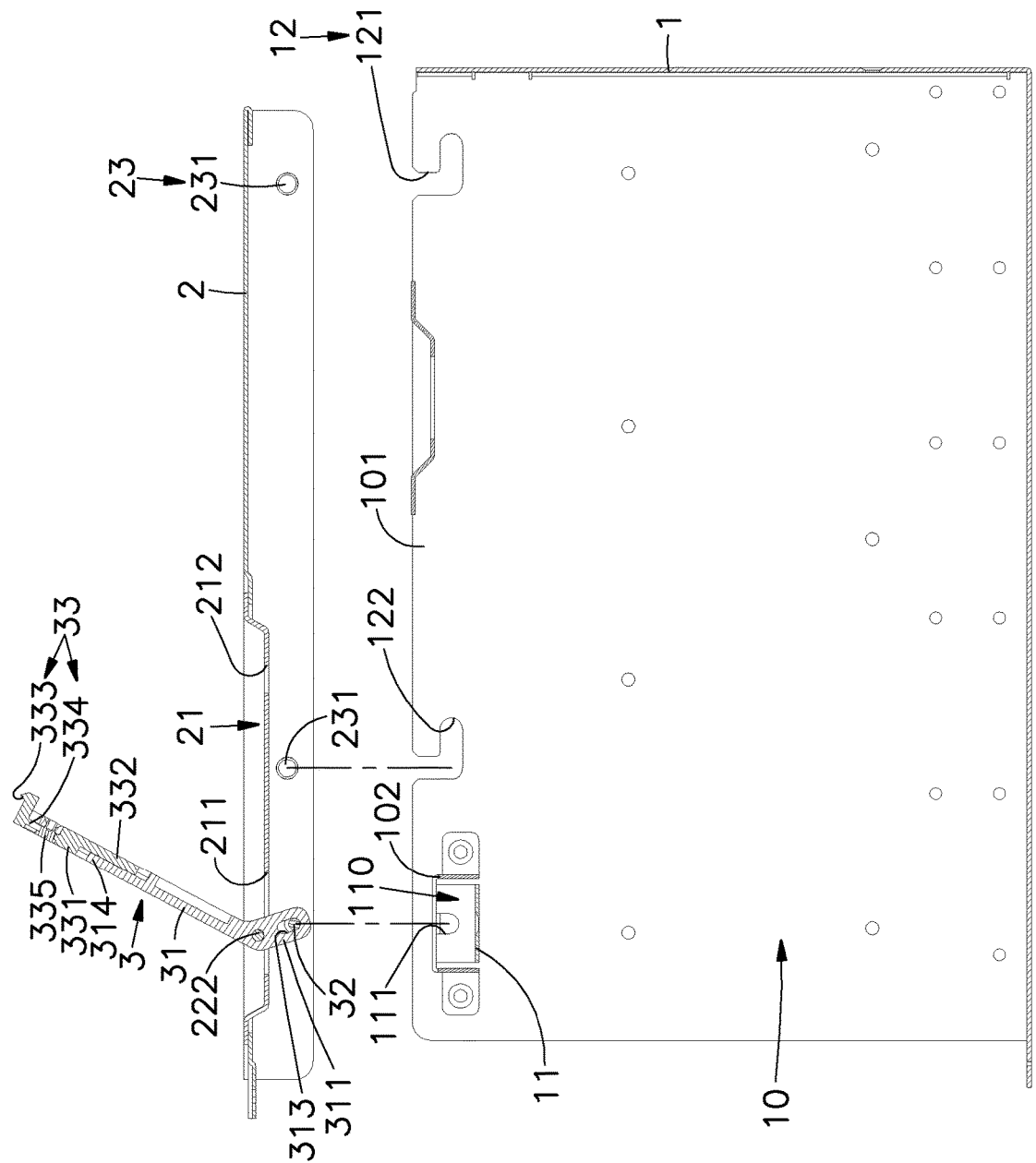
FIG. 6 is a sectional side view of the present invention before installation.
Figure 7:
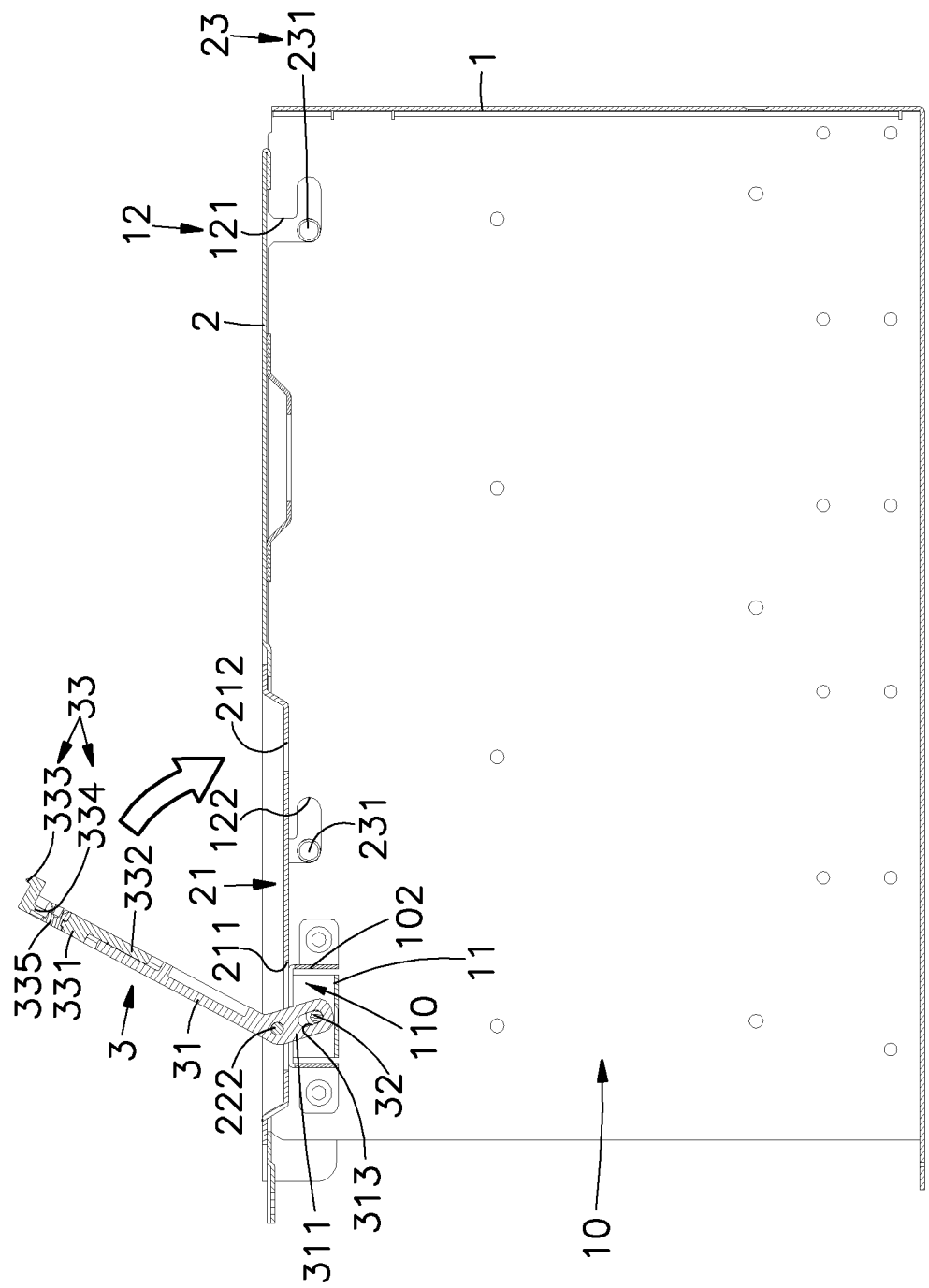
FIG. 7 is a sectional side view of the present invention, showing the assembling process of the locating device (I).
Figure 8:
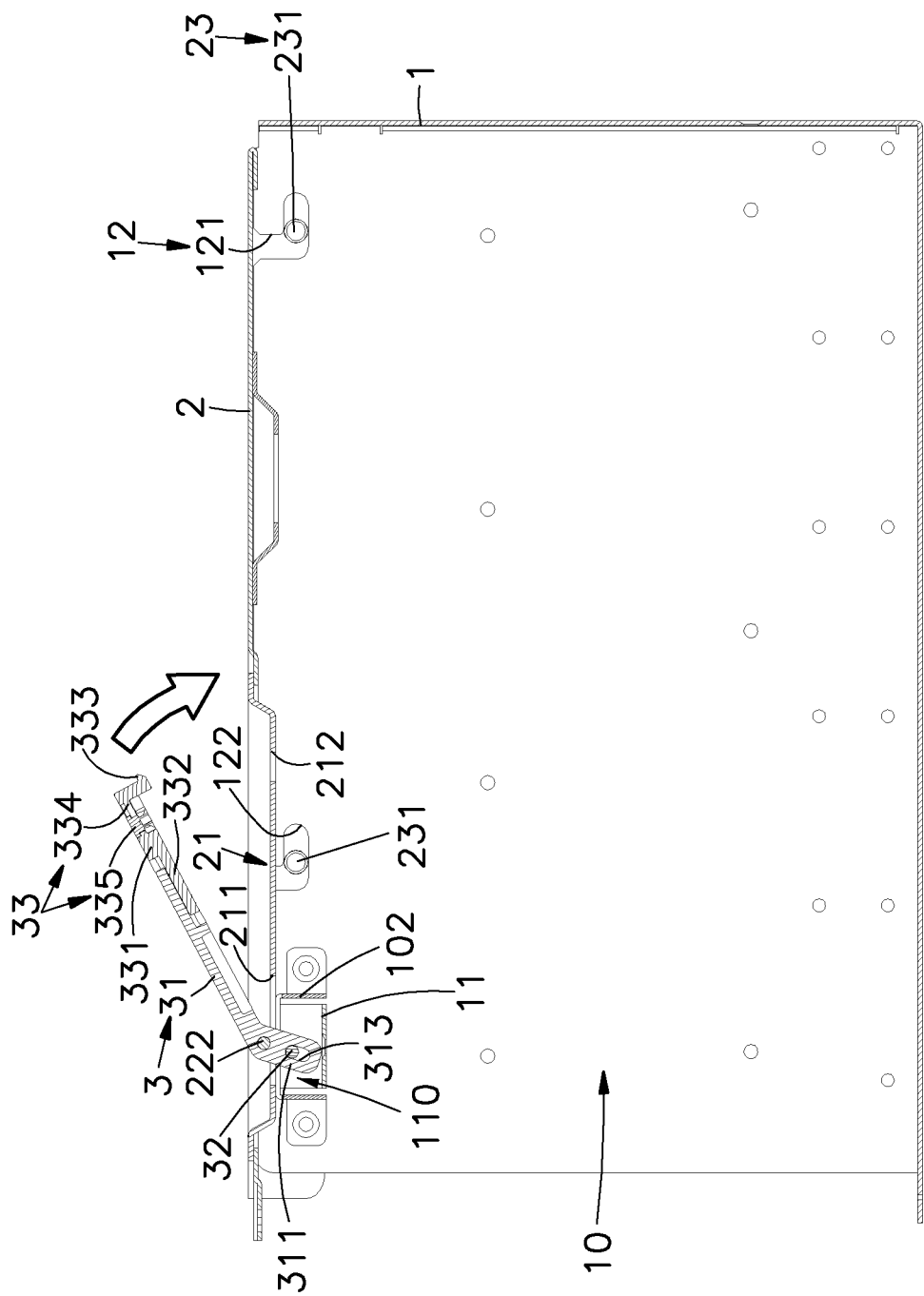
FIG. 8 is a sectional side view of the present invention, showing the assembling process of the locating device (II).
Figure 9:
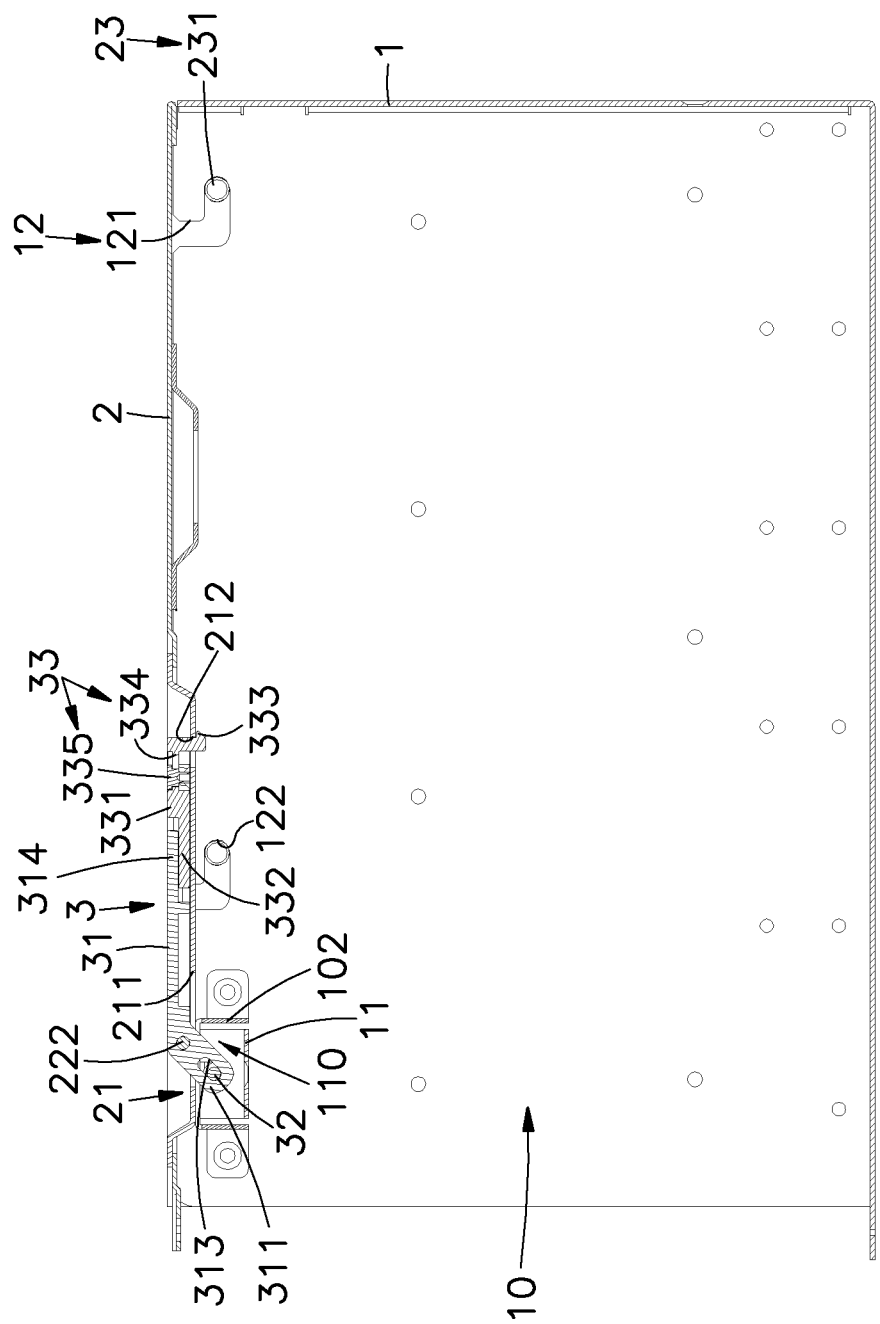
FIG. 9 is a sectional side view of the present invention, showing the locating device assembled.

Referring to FIGS. 6, 7, 8 and 9, the casing 1 can be a server chassis, computer mainframe, storage or telecom cabinet, and the fitting member 2 can be the cover of the server chassis, computer mainframe, storage or telecom cabinet. In installation, pivotally mount the lever 31 of the operating device set 3 to the recess 21 of the fitting member 2. At first, insert the pivot connection head 311 of the lever 31 through the through hole 211 to keep the sliding rod 32 of the operating device set 3 beneath the fitting member 2, then keep the pivot hole 3121 in the pivot connection portion 312 in alignment between the two axle holes 221 of the axle structure 22, and then pivotally mount the axle rod 222 in the two axle holes 221 and the pivot hole 3121 for allowing the operating device set 3 to be biased relative to the fitting member 2.

After the operating device set 3 is pivoted to the fitting member 2, turn the lever 31 of the operating device set 3 upwardly to an open position, then close the fitting member 2 on the opening 101 of the casing 1 to insert the pivot connection head 311 of the lever 31 into the receiving space 110 of the position-limiting member 11 and to further force the rollers 3211 at the respective end portions 321 of the sliding rod 32 into the respective receiving slots 111 of the position-limiting member 11. At this time, the positioning rods 231 of the positioning structure 23 of the fitting member 2 are respectively inserted into the respective sliding slots 121 of the mounting structure 12 of the casing 1. Then, turn the lever 31 of the operating device set 3 clockwise to shift the pivot connection head 311, moving the sliding slot 313 along the sliding rod 32. At this time, the pivot connection portion 312 of the lever 31 is moved backward to force the fitting member 2 backward, and the positioning rods 231 of the positioning structure 23 of the fitting member 2 are respectively moved from the respective sliding slots 121 of the mounting structure 12 of the casing 1 into the respective positioning slots 122. When continuously bias the lever 31, the hook block 333 of the buckle 33 is forced by the inner wall of the retaining hole 212 to move forward and to further squeeze the elastic members 3321 against the front plate 332. As soon as the hook block 333 passes the retaining hole 212, the elastic restoring energy of the elastic members 3321 force the hook block 333 to hook in the retaining hole 212. At this time, the operating device set 3 is closed, locking the positioning rods 231 in the respective positioning slots 122, and thus, the fitting member 2 is locked to the casing 1.

When going to remove the fitting member 2 from the casing 1, push the buckle 33 of the operating device set 3 forward to keep the hook block 333 of the buckle 33 in alignment with the retaining hole 212 in the recess 21, then bias the operating device set 3 counter-clockwise to the open position to move the hook block 333 away from the constraint of the retaining hole 212. During counter-clockwise biasing of the operating device set 3, the pivot connection head 311 of the lever 31 is forced to move the sliding slot 313 backward along the sliding rod 32, and the pivot connection portion 312 of the lever 31 is forced to move forward, causing the fitting member 2 to be moved forward and opened. At the same time, the positioning rods 231 of the positioning structure 23 are moved away from the constraint of the respective positioning slots 122 of the mounting structure 12 to unlock the fitting member 2, allowing lifting of the fitting member 2 from the casing 1, and thus, the fitting member 2 can be removed from the casing 1.

The present invention has the following advantages:

1. When biasing the lever 31 of the operating device set 3, the lever 31 is moved with the sliding slot 313 along the sliding rod 32, causing smooth displacement of the pivot connection portion 312 of the lever 31 to carry the pivotally connected fitting member 2 into engagement with the casing 1. After the lever 31 is biased to the close position, the positioning structure 23 of the fitting member 2 is locked to the mounting structure 12 of the casing 1. This mounting design needs not to use complicated assembly actions such as screw locking, so as to reduce the overall operation difficulty and achieve the purpose of improving the overall assembly speed.

2. After the fitting member 2 is positioned in the casing 1, the design of the receiving slot 111 of the position-limiting member 11 prevents disconnection of the fitting member 2 from the casing 1 in the horizontal direction. Further, the engagement between the mounting structure 12 of the casing 1 and the positioning structure 23 of the fitting member 2 prevents disconnection of the fitting member 2 from the casing 1 in the vertical direction. Therefore, when the operating device set 3 is biased to the close position, the fitting member 2 is prohibited from moving out of the casing 1 in the horizontal direction or the vertical direction, ensuring connection stability.

3. When the operating device set 3 is biased from the open position to the close position, the fitting member 2 is locked to the casing 1. By means of one single biasing action to lock the fitting member 2 to the casing 1, the operation of the present invention is simple. This makes it easy to operate, and speeds up the assembly of the entire installation job.

4. When moving the end portion 321 of the sliding rod 32 into the respective receiving slot 111 of the position-limiting member 11, the roller 3211 at the end portion 321 facilitates movement of the end portion 321 into the respective receiving slot 111 without causing damage to the inner wall of the receiving slot 111.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A locating device, comprising:

a casing comprising a position-limiting member on a top side thereof and a mounting structure on at least one of two opposite side walls thereof, said position-limiting member comprising a receiving space and a receiving slot on at least one of two opposite lateral sides of said receiving space;

a fitting member comprising a recess, a through hole cut through a bottom wall of said recess, an axle structure provided in said recess and a positioning structure located on at least one of two opposite side walls thereof for positioning in said mounting structure of said casing; and an operating device set comprising a lever and a sliding rod, said lever comprising a pivot connection head extended from a front side thereof and inserted through said through hole into said receiving space, a pivot connection portion located on said pivot connection head and pivotally connected to said axle structure and a sliding slot located on said pivot connection head and disposed at a side relative to said pivot connection portion, said sliding rod being movably mounted in said sliding slot, said sliding rod comprising an end portion located on at least one of two opposite ends thereof and disposed in said receiving slot;

wherein said operating device set is movable relative to said fitting member between an open position where said positioning structure of said fitting member is unlocked from said mounting structure of said casing and a close position where said positioning structure of said fitting member is locked to said mounting structure of said casing; when said operating device set is moved from said open position to said close position, said lever is moved with said sliding rod in said sliding slot, causing displacement of said pivot connection portion to carry said fitting member to move relative to said casing, wherein said axle structure of said fitting member comprises two axle holes respectively located on two opposite side walls of said recess, and an axle rod mounted between said two axle holes; said pivot connection portion of said lever comprises a pivot hole pivotally coupled to said axle rod of said axle structure of said fitting member.

2. The locating device as claimed in claim 1, wherein said casing comprises an accommodation chamber defined therein, an opening located on a top side thereof in communication with said accommodation chamber, and a bracket mounted in said opening to support said position-limiting member; said fitting member is adapted for mounting in said opening of said casing to close said accommodation chamber.

3. The locating device as claimed in claim 1, wherein said mounting structure of said casing comprises a plurality of sliding slots vertically downwardly extended from the topmost edge of each of the two opposite side walls of said casing, and a positioning slot transversely extended from a bottom end of each said sliding slot; said positioning structure of said fitting member comprises a plurality of positioning rods protruded from each of two opposite sides thereof, said positioning rods being moved away from the respective said positioning slots when said operating device set is in said open position, said positioning rods being respectively engaged in said positioning slots when said operating device set is in said close position.

4. The locating device as claimed in claim 1, wherein said fitting member further comprises a retaining hole cut through a bottom wall of said recess; said lever further comprises a mounting plate disposed opposite to said pivot connection head, and a buckle fastened to said mounting plate, said buckle comprising a hook block protruded from a bottom side thereof for hooking in said retaining hole in said close position.

5. The locating device as claimed in claim 4, wherein said lever further comprises a mounting groove located on a bottom side of said mounting plate, a pass-through hole cut through said mounting plate in communication with said mounting groove, and a fastening hole located on said mounting plate at one side relative to said pass-through hole; said buckle comprises a flat base, a front plate extended from a side of said base and disposed in said mounting groove, at least one elastic member mounted on a surface of said front plate and elastically abutted against an inner wall of said mounting groove, and a mounting through hole cut through said base and fastened to said fastening hole by a fastener.

6. The locating device as claimed in claim 1, wherein each said end portion of said sliding rod is mounted with a roller, said roller being disposed in one respective said receiving slot outside said pivot connection head.

7. A locating device comprising an operating device set, said operating device set comprising a lever and a sliding rod, wherein said lever comprises a pivot connection head extended from a side thereof, a pivot connection portion located on said pivot connection head, and a sliding slot located on said pivot connection head and disposed at a side relative to said pivot connection portion, said sliding rod being movably mounted in said sliding slot, said sliding rod comprising an end portion located on at least one of two opposite ends thereof, said operating device set being movable relative to a fitting member between an open position where a positioning structure of said fitting member is unlocked from a mounting structure of a casing and a close position where said positioning structure of said fitting member is locked to said mounting structure of said casing; when said operating device set is moved from said open position to said close position, said lever is moved with said sliding rod in said sliding slot, causing displacement of said pivot connection portion to carry said fitting member to move relative to said casing, wherein said casing comprises a position-limiting member on a top side thereof and an accommodation chamber defined therein, an opening located on a top side thereof in communication with said accommodation chamber, and a bracket mounted in said opening to support the position-limiting member; said fitting member is adapted for mounting in said opening of said casing to close said accommodation chamber.

8. The locating device as claimed in claim 7, wherein said lever further comprises a mounting plate disposed opposite to said pivot connection head, and a buckle fastened to said mounting plate, said buckle comprising a hook block protruded from a bottom side thereof.

9. The locating device as claimed in claim 7, wherein each said end portion of said sliding rod is mounted with a roller, said roller being disposed outside said pivot connection head.

* * * * *